(12) United States Patent
Renaudin et al.

(10) Patent No.: US 8,854,075 B2
(45) Date of Patent: Oct. 7, 2014

(54) DELAY-INSENSITIVE ASYNCHRONOUS CIRCUIT

(71) Applicant: Tiempo, Montbonnot St-Martin (FR)

(72) Inventors: Marc Renaudin, Biviers (FR); David Nguyen Van Mau, Seyssinet Pariset (FR)

(73) Assignee: Tiempo, Montbonnot St-Martin (FR)

( * ) Notice: Subject to any disclaimer, the term of this patent is extended or adjusted under 35 U.S.C. 154(b) by 78 days.

(21) Appl. No.: 13/785,770

(22) Filed: Mar. 5, 2013

(65) Prior Publication Data

US 2013/0234758 A1    Sep. 12, 2013

(30) Foreign Application Priority Data

Mar. 6, 2012   (FR) ...................................... 12 00669
Mar. 6, 2012   (FR) ...................................... 12 00670

(51) Int. Cl.
*H03K 19/003* (2006.01)
*H03K 19/177* (2006.01)

(52) U.S. Cl.
CPC ........ *H03K 19/17764* (2013.01); *H03K 19/003* (2013.01)
USPC .................................. 326/9; 326/11; 326/93

(58) Field of Classification Search
CPC ....................... H03K 19/17764; H03K 19/003
USPC .................................................. 326/9–11, 93
See application file for complete search history.

(56) References Cited

U.S. PATENT DOCUMENTS

| | | | |
|---|---|---|---|
| 4,845,633 A | | 7/1989 | Furtek |
| 5,450,020 A | * | 9/1995 | Jones et al. ...................... 326/31 |
| 5,646,554 A | * | 7/1997 | Kim et al. ......................... 326/93 |
| 7,729,893 B2 | * | 6/2010 | Jeong et al. ....................... 703/2 |
| 7,934,031 B2 | * | 4/2011 | Lines et al. .................... 710/100 |
| 8,171,330 B2 | * | 5/2012 | Renaudin et al. ............. 713/401 |
| 2003/0095556 A1 | | 5/2003 | Horie et al. |
| 2010/0283502 A1 | * | 11/2010 | Martin et al. ...................... 326/9 |

FOREIGN PATENT DOCUMENTS

JP    A-2002-164779    6/2002

OTHER PUBLICATIONS

Berkel, "Beware the isochronic fork," N. V. Philips' Gloeilampenfabrieken, 1991.

* cited by examiner

*Primary Examiner* — Jason M Crawford
(74) *Attorney, Agent, or Firm* — Oliff, PLC

(57) ABSTRACT

The asynchronous circuit includes a fork having at least two branches, each branch being connected to a logic gate so that the logic gate receives as input a branch-ending signal. It further includes a circuit for branching the branch-ending signal at the level of each logic gate to form a branched signal, and a blocking circuit comprising a Muller gate and receiving as input at least one branched signal, the blocking circuit being configured to prevent the propagation of an output signal when the branch-ending signals are in different logic states.

12 Claims, 8 Drawing Sheets

DELAY-INSENSITIVE ASYNCHRONOUS CIRCUIT

BACKGROUND OF THE INVENTION

The invention relates to the design of asynchronous circuits, and more specifically to asynchronous circuits whose operation is guaranteed independently from propagation delays.

STATE OF THE ART

Unlike synchronous circuits, asynchronous circuits use no global clock signal to synchronize the execution of its components. Asynchronous circuit components synchronize locally, using a request and acknowledge type communication protocol. Any transmission of data between a sender component and a receiver component has to be acknowledged by the receiver in order for the sender to be able to transmit again.

The most commonly used protocol is the four-phase handshake protocol, also called "return-to-zero" protocol. The protocol comprises the following different phases:
  the sender sends data to the receiver;
  the receiver detects the data, performs the processing for which it is intended, and generates an acknowledgement signal;
  the sender detects the acknowledgement signal and invalidates the data; and
  the receiver detects the invalid state of the data and deactivates the acknowledgement signal.

The sender detects the inactive state of the acknowledgement signal and can then transmit new data (if available), which marks the beginning of a new communication cycle.

Several classes of asynchronous circuits can be distinguished. They are defined according to the timing assumptions to be respected by the asynchronous circuits.

Delay-insensitive asynchronous circuits have no timing assumption. Their correct operation is independent from signal propagation delays in the logic gates and in the wires connecting these gates. In practice, their use is limited, since not all logic functions can be achieved with one-output logic elements. Indeed, the only one-output components truly insensitive to delays are inverters and Muller gates (or "C-elements") with several inputs, having the following logic table:

|   | a |   |
|---|---|---|
| b | 0 | 1 |
| 0 | 0 | $s^{-1}$ |
| 1 | $s^{-1}$ | 1 |

Output s of a Muller gate having two inputs a and b copies inputs a and b when they are identical. When inputs a and b differ, output s remains in its previous state ($s^{-1}$).

The class of quasi delay-insensitive circuits introduces the isochronic fork timing assumption. The notion of isochronic fork is the minimum required assumption to achieve any logic function based on one-output logic elements. A fork is a wire that connects a sender to at least two logic gates. A fork is called isochronic when the propagation times between the sender and each logic gate are assumed to be identical.

FIG. 1 shows for example purpose an isochronic fork F having two branches B0 and B1 used in an asynchronous circuit. An input signal E of the fork is duplicated in each of branches B0 and B1. The end of each branch B0, B1, opposite to node N of the fork, is connected to a logic gate G0, G1. Thus, gates G0 and G1 respectively receive branch-ending signals X0 and X1. Signals X0 and X1 are also called branch outputs of the fork.

The propagation time of input signal E to branch output X0 in branch B0 is assumed to be equal to the propagation time of signal E to branch output X1 in branch B1. It is thus possible to only test one branch and to assume that the signal has propagated similarly in the other branch of the fork. Indeed, by definition of an isochronic fork, the transitions (rising or falling) of input signal E exclusively propagate through G0 or G1.

In practice, this condition of propagation time equality appears to be too strong and the functional correctness of the asynchronous circuit allows a difference in delay between branches. In other words, the circuit remains functional as long as the delay difference between branches does not exceed a maximum value. This maximum difference is called slack.

FIGS. 2 to 7 illustrate the notion of slack in a simple example of asynchronous circuit. This circuit performs a demultiplexing function and comprises a single isochronic fork.

The circuit comprises an isochronic fork F with two branches B0 and B1, such as described in relation with FIG. 1. Logic gates G0 and G1 here are Muller gates with two inputs and one output. Each gate G0, G1 receives as input branch-ending signal X0, X1 and a selection signal C0, C1. The output signals of logic gates G0 and G1 are respectively named S0 and S1.

In this example, fork F is placed in the data path. It propagates a data signal E originating from a sender, placed upstream of fork F, towards two receivers arranged downstream of logic gates G0, G1. For clarity, the sender and the receivers are not shown in FIGS. 2 to 7.

The circuit further comprises an "AND" gate placed in the acknowledgement path, from the receivers to the sender. Signals S0ack and S1ack, at the input of the "AND" gate, are the acknowledgement signals from outputs S0 and S1. The output of the "AND" gate conveys acknowledgement signals Eack and Cack, which enable to formulate a request to the sender.

The demultiplexing function provided by this circuit aims at synchronizing signal E with one of selection signals C0, C1, and to direct signal E towards the selected output. Since signals C0 and C1 are exclusive of each other, the other output is passive and remains in an inactive state.

FIG. 2 corresponds to an initial state of the circuit. The signals of the data path, at the input (E), at the branch ends (X0 and X1) and at the outputs of the logic gates (S0 and S1), are in a low logic state (logic level '0'). Selection signals C0 and C1 also are in the low state. Conversely, acknowledgement path signals S0ack, S1ack, Eack, and Cack initially are in a high logic state ('1').

FIGS. 3 to 6 show the circuit state in each of the four phases of the communication protocol. The full lines symbolize wires conveying signals at '0' and the dotted lines symbolize wires conveying signals at '1'.

In FIG. 3, the high state of acknowledgement signals Eack and Cack informs the sender that new data can be sent. Input signal E then switches from '0' to '1'. One of the selection signals, here C0, also switches to '1'. Both inputs of Muller gate G0 being '1', output signal S0 also switches to '1'.

In FIG. 4, the receiver detects the state switching of S0 and acknowledges receipt by having signal S0ack switch to '0'.

Signals Eack and Cack at the output of the "AND" gate then switch to '0' (Eack=Cack=S0ack.S1ack).

As it sees the acknowledgement signals activated, the sender invalidates the data (FIG. 5). Input signal E and selection signal C0 both switch back to '0'. The transition of signal E, from '1' to '0', propagates in the fork to branch outputs X0 and X1, and then to output S0 of Muller gate G0 (S1 already being at '0').

In FIG. 6, the receiver detects the invalid state of the data at S0 and deactivates acknowledgement signal S0ack, which switches back to '1'. Signals Eack and Cack also switch to '1', which results in requesting the sending of new data. The circuit has then returned to its initial state.

FIG. 7 now illustrates the erroneous behavior of the circuit when the delay difference between branches is too large (equality or quasi-equality of the delays not respected).

For this purpose, it is assumed that branch B1 of the fork is much slower than branch B0. At the step of FIG. 5, the transition from '1' to '0' of signal E will not immediately propagate in branch B1. Now, when new data will be requested (at the step of FIG. 6), the activation of signal C1 will result in a premature trigger of gate G1 before the new data E will have started propagating in the fork (FIG. 7).

Such a malfunction of the circuit can be observed each time the delay dispersion between branches B0, B1 is greater than the slack, that is, than the time necessary to observe the invalid state of S0 (FIG. 5), the inactive state of acknowledgement signal S0ack (FIG. 6), and the activation of selection signal C1 (FIG. 7).

The slack depends on the examined circuit since it is equal to the sum of the signal propagation times in each circuit element (wires, logic gates, receiver and sender).

FIG. 8 shows the distribution of the isochronic forks of a more complex asynchronous circuit (approximately 6,000 isochronic forks), according to the delay dispersion in these forks.

It can be observed that most isochronic forks have a delay dispersion smaller than 1 ps. However, a number of forks have a high dispersion, up to 30 ps. These forks risk malfunctioning if the slack in this type of circuit is lower than 30 ps. Now, a single branch that does not respect the slack is sufficient for the circuit to be inoperative.

The propagation delays in an isochronic forks are capable of varying during the circuit operation, for example under the effect of temperature or pressure. The delay dispersion between branches may thus increase along time. It may even vary from one circuit to another, due to manufacturing process fluctuations. Circuits which tolerate such delay variations should thus be designed.

SUMMARY OF THE INVENTION

A need therefore exists to provide an asynchronous circuit more robust against delay variations in an isochronic fork.

This need tends to be satisfied by providing in the asynchronous circuit a fork having at least two branches, each branch being connected to a logic gate so that the logic gate receives as input a branch-ending signal, a circuit for branching branch-ending signal at the level of each logic gate to form a branched signal, and a blocking circuit comprising a Muller gate and receiving as input at least one branched signal. The blocking circuit is configured to prevent the propagation of an output signal when the branch-ending signals are in different logic states.

The blocking circuit is preferably separate from each logic gate.

In a first embodiment of the invention, the blocking circuit receives as input all branch-ending signals, one at least being branched by a branching circuit.

According to a development, the blocking circuit receives as input all the branched signals and a signal to be blocked, the output signal being an acknowledgement signal.

In a second embodiment of the invention, the asynchronous circuit comprises a blocking circuit for each logic gate, each blocking circuit comprising a Muller gate and receiving as input the branched signal associated with the logic gate and a data signal to be blocked, the output of the blocking circuit being connected to an input of the logic gate.

The invention also aims at a method enabling to decrease the delay sensitivity of an asynchronous circuit. The method comprises the steps of:

selecting a first isochronic fork having a first level of danger and comprising at least two branches, each connected to a logic gate;

introducing a circuit for branching the branch-ending signal at the level of each logic gate to form a branched signal; and providing a blocking circuit comprising a Muller gate and receiving as input at least one branched signal, the blocking circuit being configured to prevent the propagation of an output signal when the branch-ending signals are in different logic states.

According to a development of the method, a second isochronic fork having a second level of danger, lower than the first level of danger is selected, the second isochronic fork comprising at least two branches, each connected to a logic gate, and the logic gates associated with the second fork are arranged in a limited area of the circuit, so as to limit the propagation delay dispersion between the branches of the second fork.

BRIEF DESCRIPTION OF THE DRAWINGS

The foregoing and other features and advantages will be discussed in detail in the following non-limiting description of specific embodiments in connection with the accompanying drawings, among which.

DESCRIPTION OF A PREFERRED EMBODIMENT OF THE INVENTION

It is described hereafter two techniques for designing an asynchronous circuit, which enable to increase the robustness of the circuit against propagation delays. Such techniques aim at removing the isochronic fork timing assumption.

One of these techniques provides blocking the signal propagation in the asynchronous circuit when the branch-ending signals, or branch outputs, are in different logic states. Any malfunction of the circuit caused by too large a delay dispersion between branches is thus avoided.

In other words, when a logic transition at the fork input has not propagated all the way to the output of one of its branches, a new event such as the sending of new data by the sender cannot be generated. This event is delayed as long as the transition has not reached the output of the slowest branch.

All the circuits discussed hereafter implement a four-phase handshake communication protocol between a sender and a receiver. They comprise at least one isochronic fork. This fork is characterized in that a single one of the logic gates connected to its branches triggers for each propagation of the fork input signal.

In a first embodiment of robust asynchronous circuit, a circuit for branching the branch-ending signal is arranged at the level of each logic gate of the fork. Each branching circuit copies the output of a branch, then "branches" it at the input of the logic gates arranged in the other branches. Instead of receiving a single branch output, the logic gates then receive all fork branch outputs.

In the following description, a "branched signal" may designate either an identical copy of a signal, as in this first embodiment, or an inverted copy of this signal.

Figure 1:
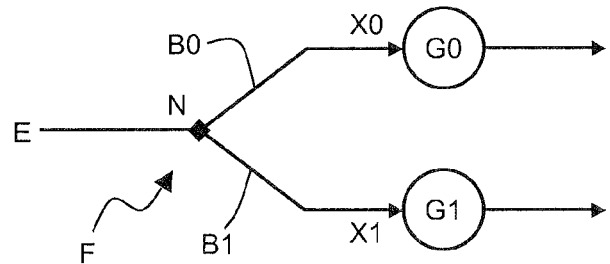
FIG. 1 is the conventional diagram of an isochronic fork in an asynchronous circuit.
Figure 2:
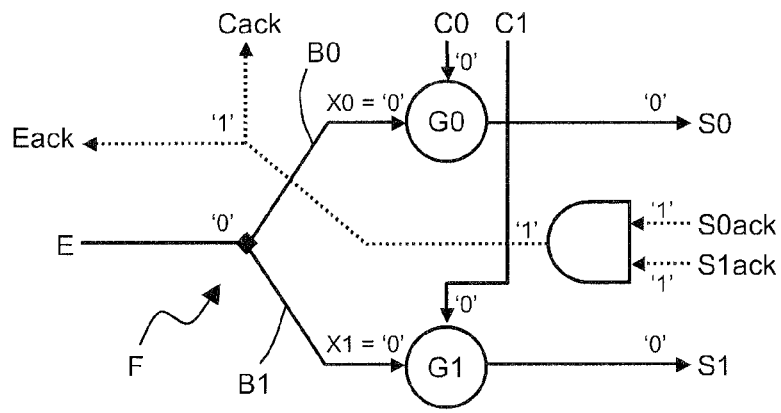
FIG. 2 is the logic circuit of a demultiplexing function according to prior art.
Figure 3:
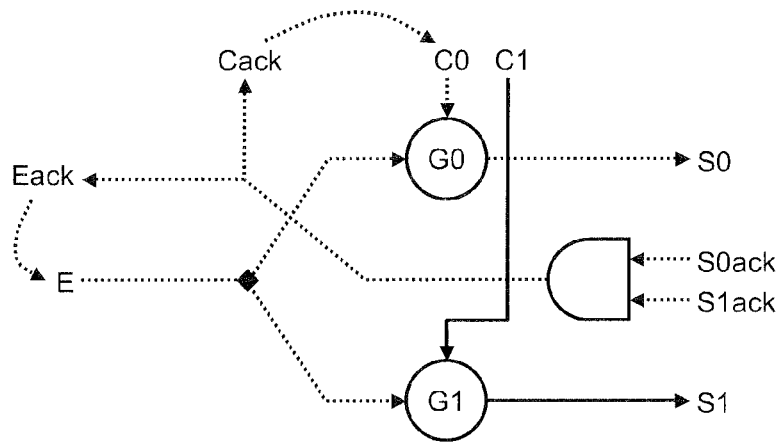
FIGS. 3 to 6 show the demultiplexing circuit of FIG. 2, in the four phases of a request-acknowledge communication protocol.
Figure 4:
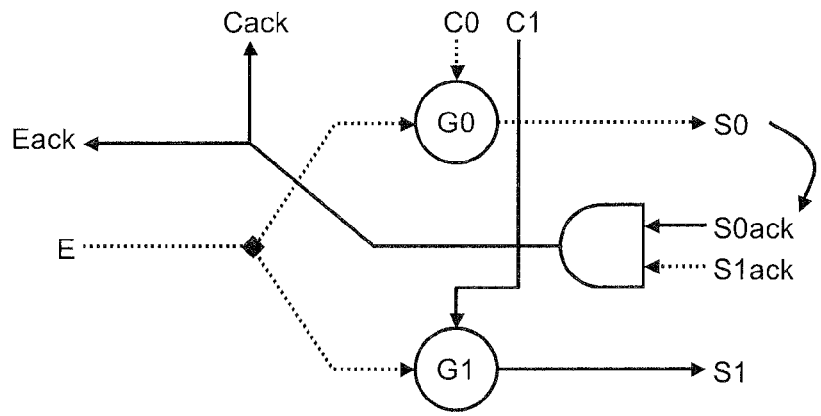
Figure 5:
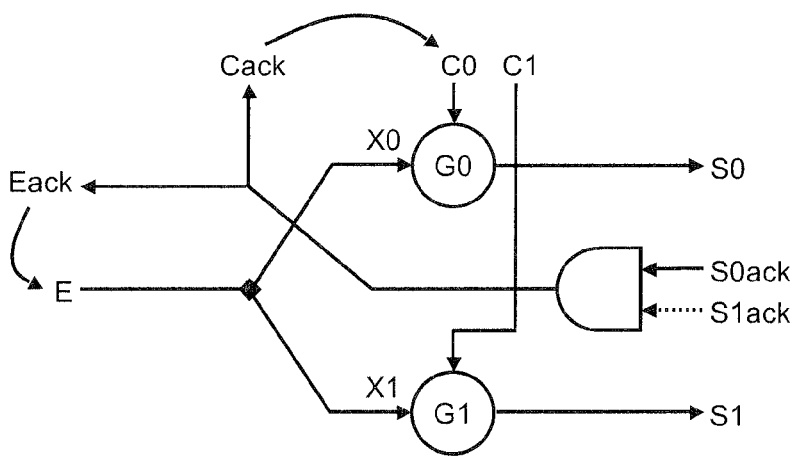
Figure 6:
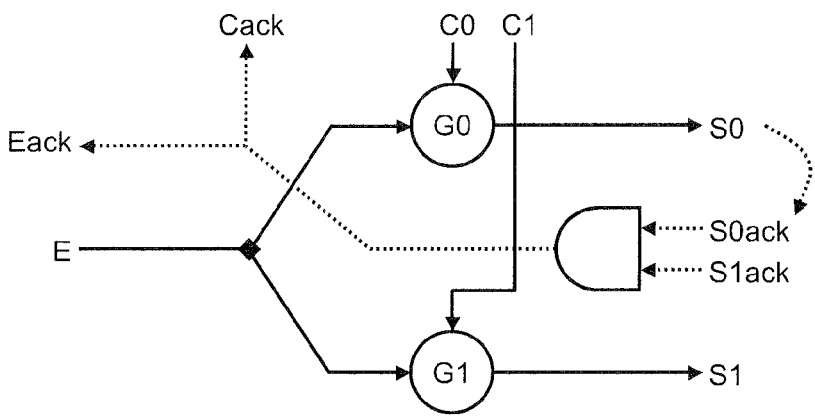
Figure 9:
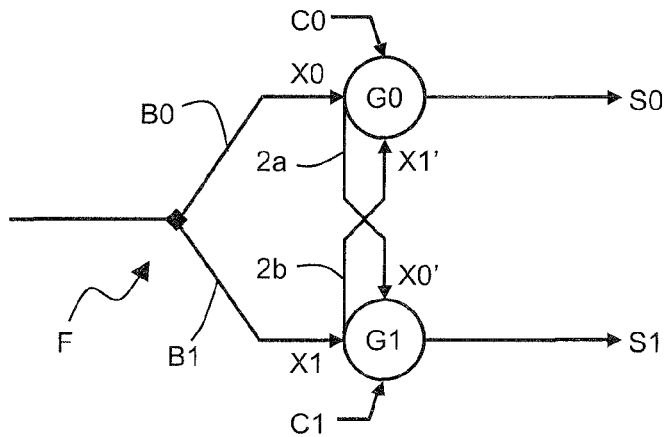
FIGS. 9 and 10 show two embodiments of a demultiplexing function, according to a first asynchronous circuit design technique of the invention.

FIG. 9 shows an example of an asynchronous circuit according to the first embodiment. For this example, the circuit of FIG. 2, which implements a demultiplexing function, is shown, once its acknowledgement circuit has been removed.

The demultiplexing circuit, called "DMUX" hereafter, comprises, as previously, a fork F with two branches B0, B1 and two Muller gates G0, G1. Each gate G0, G1 receives as input two signals, output X0, X1 of the branch to which is it connected, and a selection signal C0, C1.

Circuit DMUX further comprises two branching circuits 2a and 2b. Each branching circuit is formed of an additional connection wire between the two gates. Connection 2a duplicates branch output X0 into a signal X0' and directs it towards a third input of gate G1. Similarly, connection 2b copies signal X1 and conveys copied signal X1' to a third input of gate G0. In this example, gates G0 and G1 thus are Muller gates having three inputs and two outputs, a data output S0, S1 and an output having branching circuit 2a, 2b connected thereto.

Thus, gate G0 receives at its input branch output X0 and branch output X1 via branching circuit 2b, and gate G1 receives at its input branch output X1 and branch output X0 via branching circuit 2a.

Muller gates G0 and G1 behave as blocking circuits in the asynchronous circuit, verifying the logic state of all branch outputs. Output signal S0 or S1 (according to the selected signal C0 or C1) is only generated when branch outputs X0 and X1 are in the same state.

Branching circuits 2a and 2b guarantee the operation of the asynchronous circuit whatever the propagation delays in the fork branches. On the other hand, the circuit is substantially slower since it is necessary to wait for the switching of all branch outputs to generate S0 or S1, which used not to be the case.

This circuit is particularly simple to implement since it is sufficient to provide, on design thereof, additional connections between logic gates G0 and G1. However, the complexity of the circuit rapidly increases with the number of branches. Indeed, the number of additional wires and inputs in the logic gates is equal to n·(n−1) for a fork having n branches (n≥2).

This first embodiment will thus be, in practice, limited to forks having a limited number of branches and used in asynchronous circuits where speed is not a critical parameter.

In a second embodiment of asynchronous circuit, it is aimed at ensuring the circuit operation regarding the delay dispersion between branches without significantly increasing the complexity of the circuit or decreasing its speed.

For this purpose, it is provided, in addition to branching circuits 2a and 2b, a blocking circuit comprising at least one Muller gate distinct from gates G0 and G1.

Figure 10:
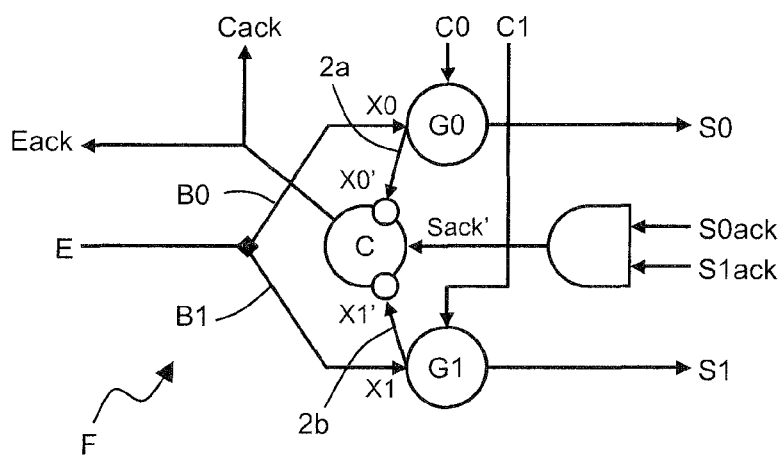

FIG. 10 shows demultiplexing circuit DMUX according to this second embodiment. The acknowledgement circuit, provided with its "AND" gate, is here shown.

Circuit DMUX comprises a blocking circuit arranged in the acknowledgement path. The blocking circuit is, in this embodiment, formed of a Muller gate C and of two inverters adjoined to gate C. Each inverter receives as input one of signals X0' and X1', branched by circuits 2a and 2b. Branched signals X0' and X1' here also are copies of branch outputs X0 and X1. The output of each inverter is directly connected to an input of Muller gate C. Gate C thus receives inverted copies of branch outputs X0 and X1 of the fork.

Further, gate C comprises a third input connected to the output of the "AND" gate. Gate C then receives an acknowledgement signal Sack' which corresponds to the product of output acknowledgement signals S0ack and S1ack, The output of the gate C corresponds to acknowledgement signals Eack and Cack sent to the sender(s) (not shown).

Figure 7:
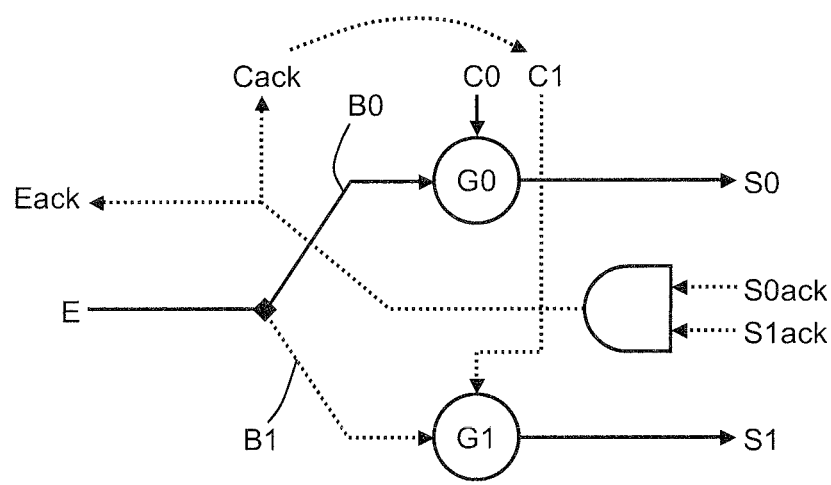
FIG. 7 shows an example of malfunction of the demultiplexing circuit of FIG. 2.

In the circuit of FIG. 10, Muller gate C blocks the propagation of acknowledgement signal Sack' when the fork branch outputs are in different logic states. The transition of acknowledgement signals Eack and Cack and the sending of new data by the sender are then delayed. Accordingly, the premature triggering of the logic gate associated with the slowest branch, described in relation with FIG. 7, can no longer occur.

Figure 11:
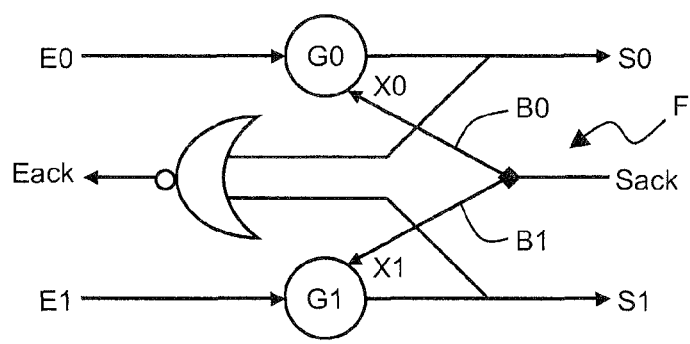
FIG. 11 shows the logic circuit of memory function according to prior art.

FIG. 11 is another example of logic function currently used in an asynchronous circuit, the buffer memory function.

The memory circuit of FIG. 11, called "BUFFER" hereafter, comprises a fork F provided with two branches B0, B1 and with two Muller gates G0, C1. Each gate G0, G1 receives as input, in addition to output X0, X1 of the associated branch, a signal E0, E1 of data to be stored.

Circuit BUFFER further comprises a "NOR" gate having its input signals corresponding to output signals S0 and S1 of gates G0 and G1. The output signal of the "NOR" gate forms acknowledgement signal Eack.

It can be observed that, in this example, fork F is now placed in the acknowledgement path, and no longer in the data path. At the fork input, data signal E is replaced with an acknowledgement signal Sack originating from the receiver.

Input signals E0 and E1 being exclusive of each other, a single one of the two data are stored. In other words, a single one of outputs S0 and S1 copies data E0 or E1. Thereby, an acknowledgement signal Sack common to both outputs S0 and S1 can be provided.

Figure 12:
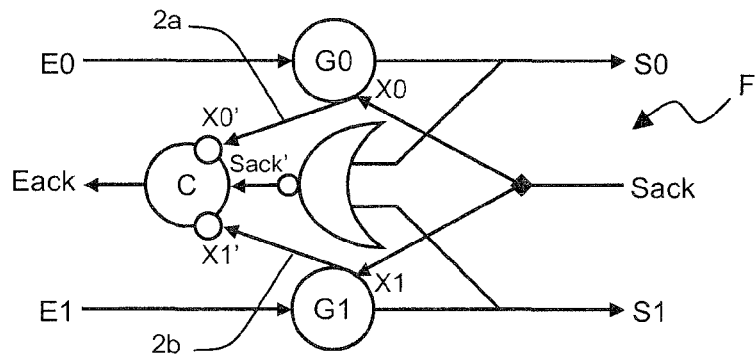
FIG. 12 shows the logic circuit of a memory function according to the first asynchronous circuit design technique of the invention.

FIG. 12 shows the circuit of the memory function after having introduced branching circuits 2a, 2b and the blocking circuit therein, to make it more robust to delay variations.

As previously, the blocking circuit may be formed of a single Muller gate C associated with two inverters. Gate C receives inverted copies of the branch outputs (via branched signals X0' and X1') and an acknowledgement signal Sack' which will have its propagation blocked when the branch-ending signals are not in the same logic state.

Thus, in the case of circuits DMUX (FIG. 10) and BUFFER (FIG. 12), the blocking circuit receives as input the branched signals of all branch outputs and comprises a Muller gate having its output signal enabling to acknowledge the data (Eack).

Such solutions are much simpler than that of FIG. 9 since Muller gate C centralizes all branched signals. The number of additional inputs to be provided is equal to the number of branches (n) of the fork plus one input for the acknowledgement signal to be blocked, Sack' (that is, n+1 additional inputs in the asynchronous circuit).

Further, the speed loss of circuits DMUX and BUFFER is decreased to a minimum. Indeed, it is non-existent in the data path since the transition of signal S0 or S1 is never delayed. The processing of signal S0 or S1 by the receiver can thus continue. In the acknowledgement path, the speed loss is equal to the propagation time in a single gate: gate C.

Figure 13:
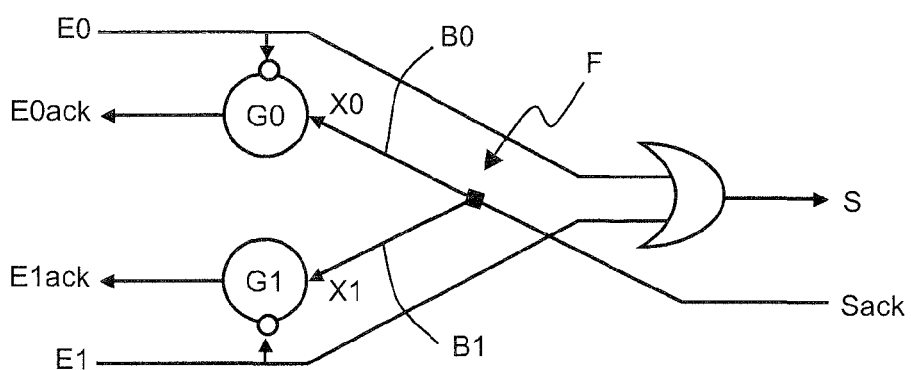
FIG. 13 shows the logic circuit of a merge function according to prior art.

FIG. 13 is a third example of a logic function commonly used in asynchronous circuits. This function enables to add or to merge two input signals E0 and E1 into a single output signal S, signals E0 and E1 being exclusive of each other. Its circuit is called "MERGE" hereafter.

Circuit MERGE comprises an "OR" gate which gathers data signals E0 and E1, and in parallel, a fork F having two branches B0 and B1. As in the case of circuit BUFFER, fork F is located in the acknowledgement path. It propagates an acknowledgement signal Sack of output S.

In this specific embodiment of the merge function, Muller gates G0, G1 are each equipped with an inverter. Each inverter receives one of data signals E0 and E1. Thus, gate G0 has as input signals branch output X0 and an inverted copy of data signal E0, while gate G1 receives as input branch output X1 and an inverted copy of signal E1.

Figure 14:
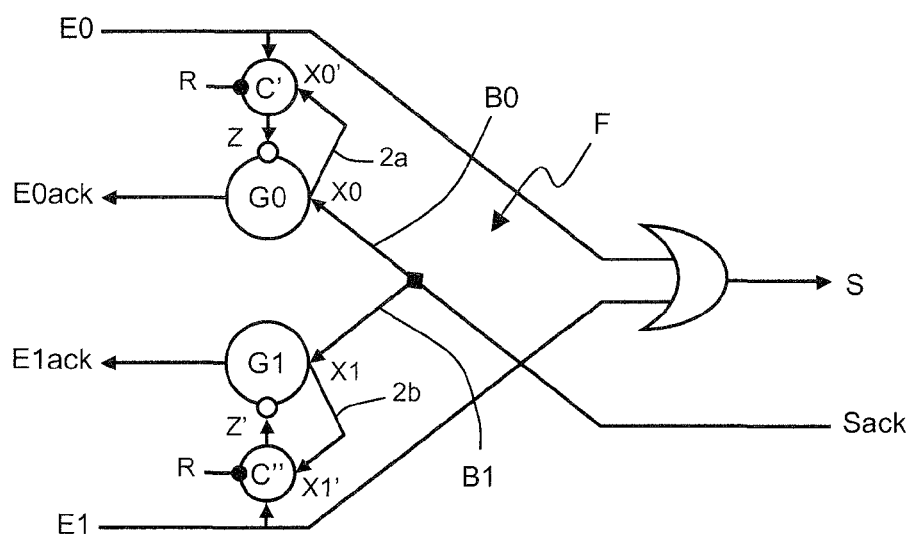
FIG. 14 shows the logic circuit of a merge function according to the first asynchronous circuit design technique of the invention.

FIG. 14 shows circuit MERGE according to the second embodiment of the invention. A blocking circuit has been introduced between each logic gate G0, G1 and the associated data signal E0, E1. There thus are as many blocking circuits as branches in the fork. Blocking circuit C', associated with gate G0, has as input signals data signal E0 and signal X0' branched by connection 2a. Similarly, blocking circuit C", associated with gate G1, receives as input signal E1 and branched output X1'. Signals X0' and X1' here also are copies of branch outputs X0 and X1.

Each blocking circuit C', C" is, in this example, formed of a Muller gate with reset. This designates a Muller gate provided with a reset signal R, which enables to set its output Z to '0'. Its logic equation is provided hereafter (in the case of gate C'):

Error! Objects cannot be created from editing field codes.

Output signal Z, Z' of each blocking circuit C', C" is conveyed to the inverter placed at the input of the corresponding Muller gate G0, G1. Each gate G0, G1 thus now receives branch output X0, X1 of the associated branch and the inverse of output signal Z, Z' of the corresponding Muller gate C', C".

The blocking occurs at the beginning of a new four-phase handshake communication cycle, when new data E0 or E1 start propagating through the circuit. Circuit C', C" blocks the propagation of input signal E0, E1 to the corresponding logic gate G0, G1 if the branch output has not returned to its initial state.

Indeed, at the end of a cycle, the fork branch outputs are supposed to return to their initial state before the beginning of a new cycle. The output of a fast branch may have reached this initial state and initiate a new cycle via signal E0ack or E1ack. However, the output of a slow branch may not have reached it when the new data are sent.

For example purpose, a first cycle where the transmitted input signal is E0 is considered. At the end of this cycle, signal E0 is in an invalid state and signal Sack switches to an inactive state (phase 4). It is then assumed that signal Sack only propagates in branch B0 to branch output X0 (branch B1 is slow). Gate G0 triggers and signal E0ack is deactivated.

A second cycle then starts with the sending of new data. If signal E1 is selected as the new data, it will be blocked by circuit C" if branch output X1 has not switched yet, that is, if it has not reached the same state as branch output X0.

In other words, blocking circuit C' or C" interrupts the propagation of input signal E0 or E1 to the corresponding gate G0 or G1 as long as the branch outputs have not all returned to the same end-of-cycle state. The blocking can only occur in the case of a change of the data signal from one cycle to the other (E0, then E1, or conversely).

Thus, the blocking circuits prevent the premature triggering of one of gates G0 and G1 when new data are requested and the corresponding branch has not switched yet. Acknowledgement signal E0ack or E1ack, at the output of gate G0 or G1, is accordingly delayed.

The circuit complexity is only increased by n Muller gates having two inputs and one output, that is, 3n additional inputs/outputs in the circuit. There is no speed penalty in the data path since the switching of gates C' and C" occurs in parallel with the processing of data E0 and E1.

Figure 15:
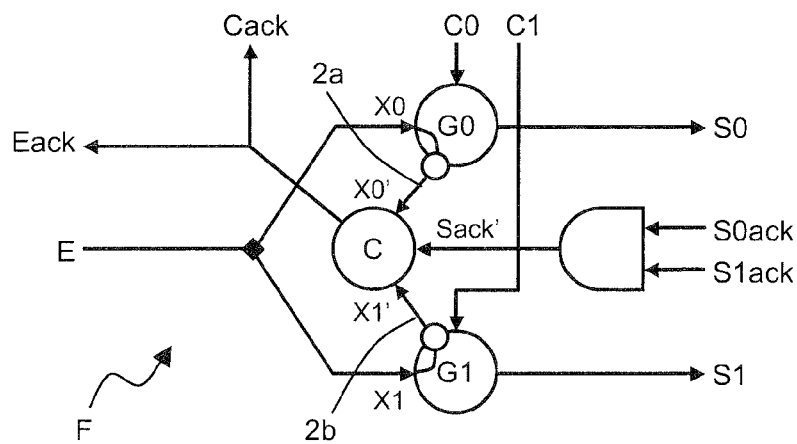
FIGS. 15 to 17 show a preferred embodiment of the logic functions of FIGS. 10, 12, and 14.
Figure 16:
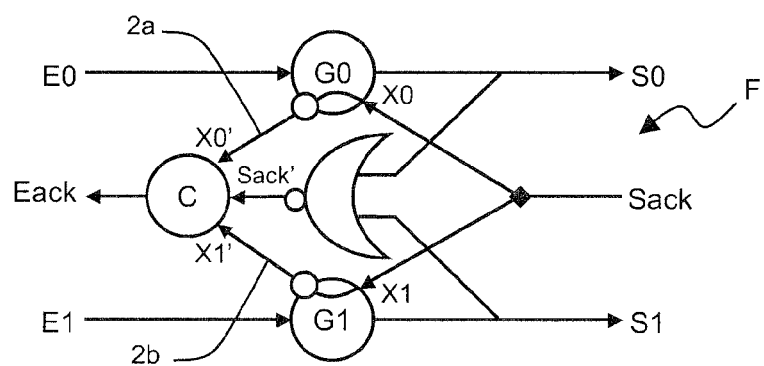
Figure 17:
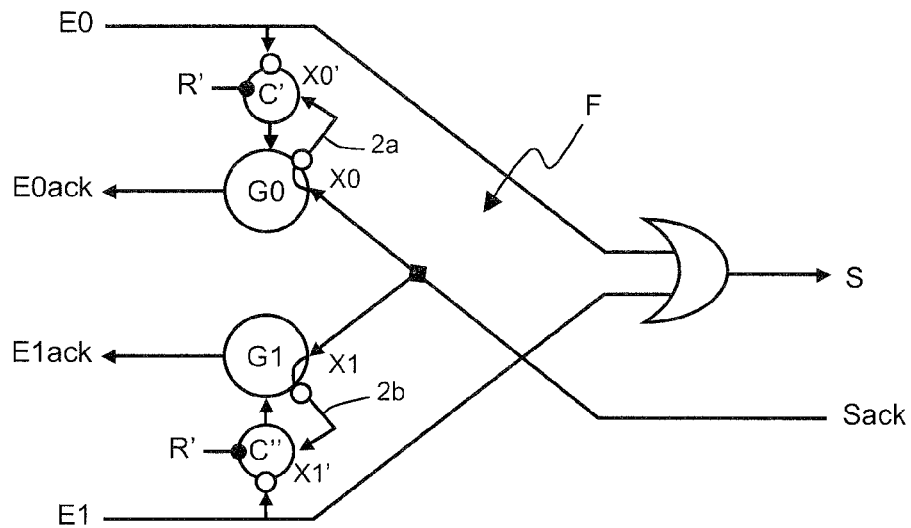

FIGS. 15 to 17 show a preferred embodiment of an asynchronous circuit where signals X0' and X1' branched by circuits 2a and 2b are inverted copies of branch outputs X0 and X1. To achieve this, an inverter is introduced into branching circuit 2a or 2b of each branch output. This inverter is advantageously placed at the level of logic gates G0 and G1.

In the case of circuits DMUX (FIG. 15) and BUFFER (FIG. 16), it means displacing the inverters located in the blocking circuit to the level of logic gates G0 and G1.

In the case of circuit MERGE (FIG. 17), an inverter may also be introduced at the level of gates G0 and G1 It is however necessary, in this case, to modify Muller gates C' and C". Reset signal R should especially be replaced with an initialization signal R' which forces its output to '1' (Error! Objects cannot be created from editing field codes.).

In this preferred embodiment, each inverter may be directly integrated into the Muller gate G0 or G1 to which it is connected, to form a single optimized logic gate. Such a logic gate will then have an additional output, which generates an inverted copy of the branch output presented at its input.

Another solution comprises creating no specific gate, but forcing the placing of the inverter at the level of Muller gate G0, G1 so that they are adjacent.

The fact of arranging an inverter at the level of each logic gate G0, G1 greatly eases the omplementation of the logic gate, and thus of the circuit. Indeed, it is easier to create, with usual CAD tools, a Muller gate which inverts one of its inputs, rather than a Muller gate which simply copies one of its inputs.

To further simplify the circuit design, it may be advantageous to merge the "AND" gate of FIG. 15 with Muller gate C or the "NOR" gate of FIG. 16 with Muller gate C, in a single optimized logic gate.

The first robust asynchronous circuit design technique has been described up to this point in relation with a two-branch fork. It may however be extended and applied to isochronic forks with a larger number of branches.

Figure 18:
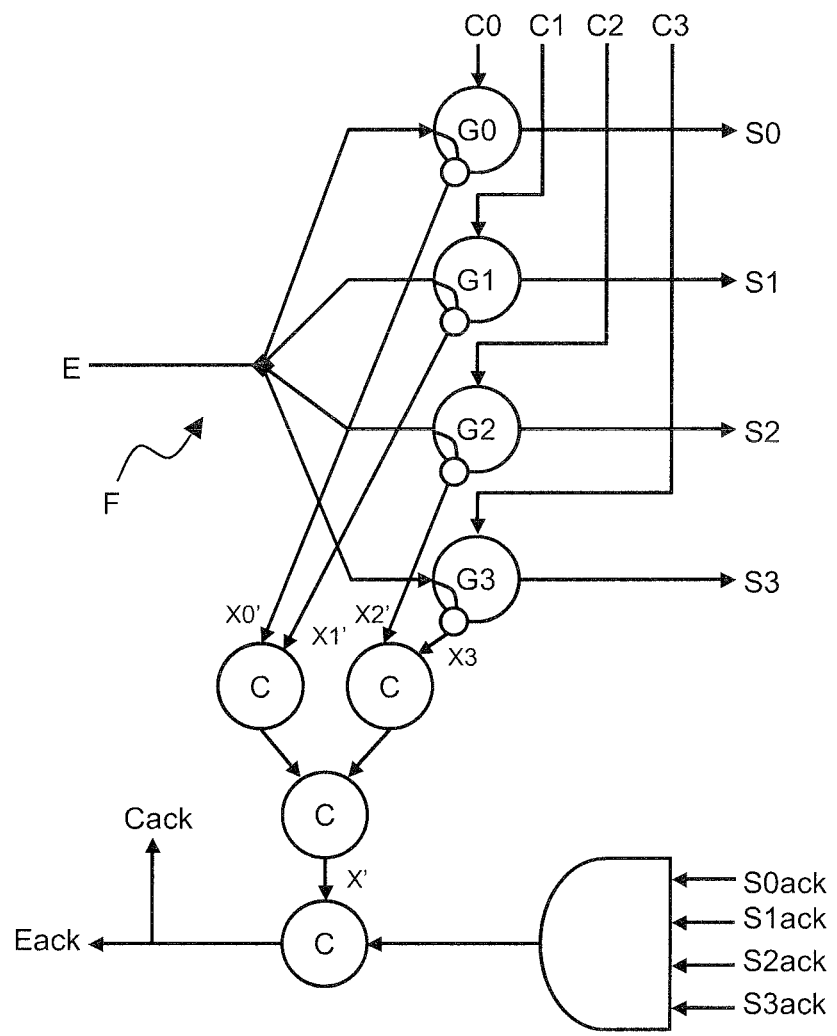
FIG. 18 shows a logic circuit of a demultiplexing function according to the invention, provided with a four-branch fork.

For example purpose, the circuit of FIG. 18 implements the demultiplexing function for a four-branch fork. The blocking circuit then comprises several Muller gates C, here four. The different gates C form a chain which gathers branched signals X0' to X3' into a single signal, noted X' in FIG. 18.

The last gate C of the chain is arranged in the acknowledgement path of circuit DMUX and receives acknowledgement signal Sack' to be blocked. Said signal results from the combination of four output acknowledgement signals S0ack to S3ack.

This first technique, described through three examples of logic function, guarantees the operation of an asynchronous circuit whatever the propagation time dispersion between the branches of its forks. No timing assumption is formulated. On the contrary, the very notion of isochronic fork is eliminated. The asynchronous circuits constructed from these examples are thus as robust as delay-insensitive circuits.

Further, this technique may be applied to any isochronic fork, and especially to the forks of a circuit that does not carry out one of the three above-discussed functions. It thus enables to generate any asynchronous circuit robust against delay variations. It further enables to use signal amplifiers in the fork branches, without worrying about time imbalances introduced by these amplifiers.

A second technique for forming a robust asynchronous circuit consists in forcing the placement of logic gates G0 and G1 of the fork. In this case, rather than the logic circuit diagram, the way in which the circuit gates are positioned with respect to one another (layout stage in the design flow) is modified.

Such a technique consists in decreasing the distance between each logic gate and node N of the fork. Logic gates G0 and G1 are then gathered in a limited area of the circuit, preferably centered with respect to node N of the fork, so that the propagation time dispersion between the fork branches is as low as possible.

Figure 19:
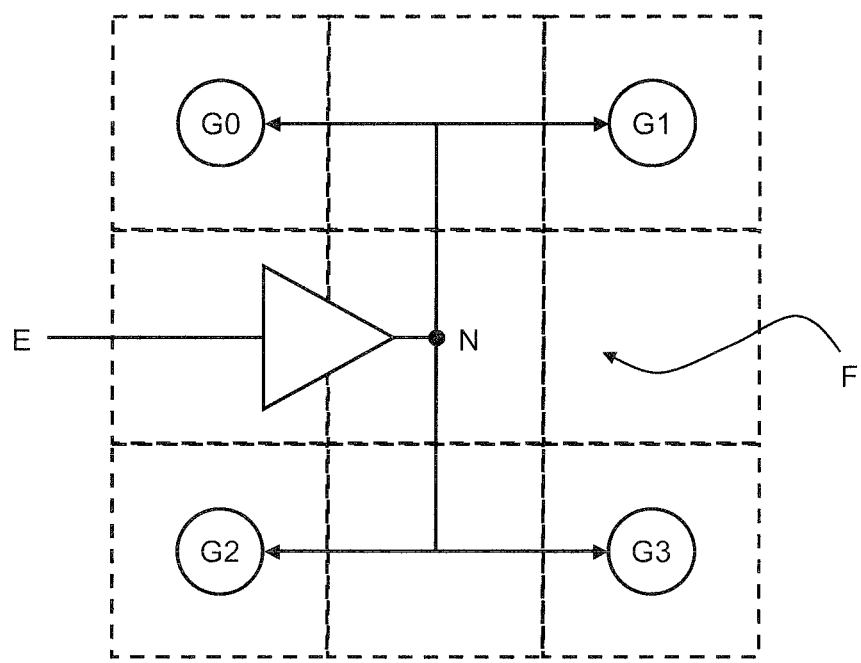
FIG. 19 shows the layout of an isochronic fork, according to a second asynchronous circuit design technique of the invention.

FIG. 19 is an example of fork F where the location of logic gates G0-G3 has been optimized. Gates G0-G3 are preferably placed at an equal distance from node N of the fork. Equal distance means that the Manhattan distances between node N and each gate G0-G3 are substantially identical.

Figure 8:
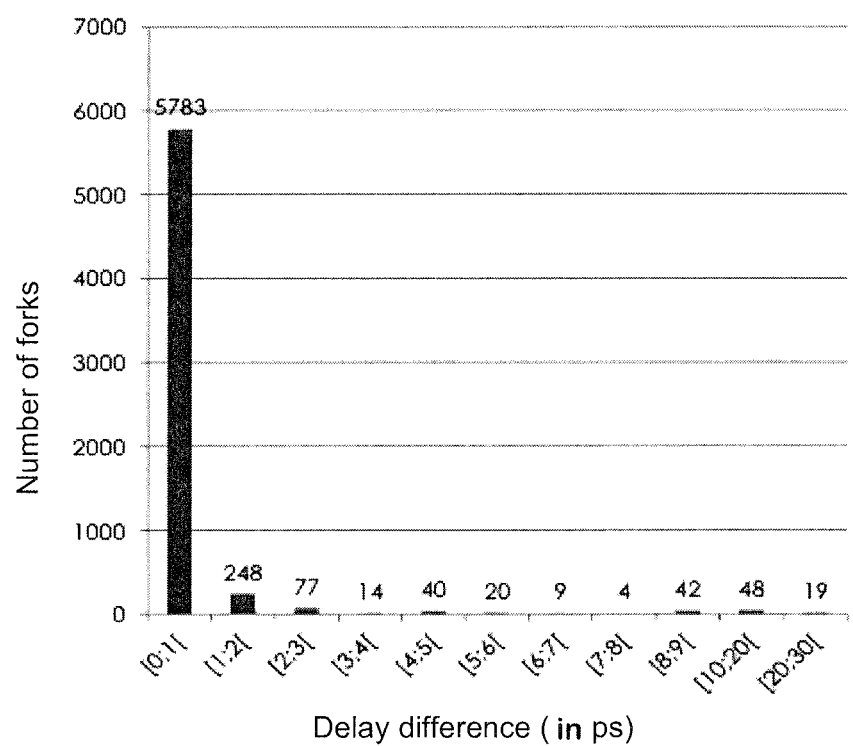
FIG. 8 shows the distribution of the isochronic forks of an asynchronous circuit according to prior art, versus the time dispersion of its forks.
Figure 20:
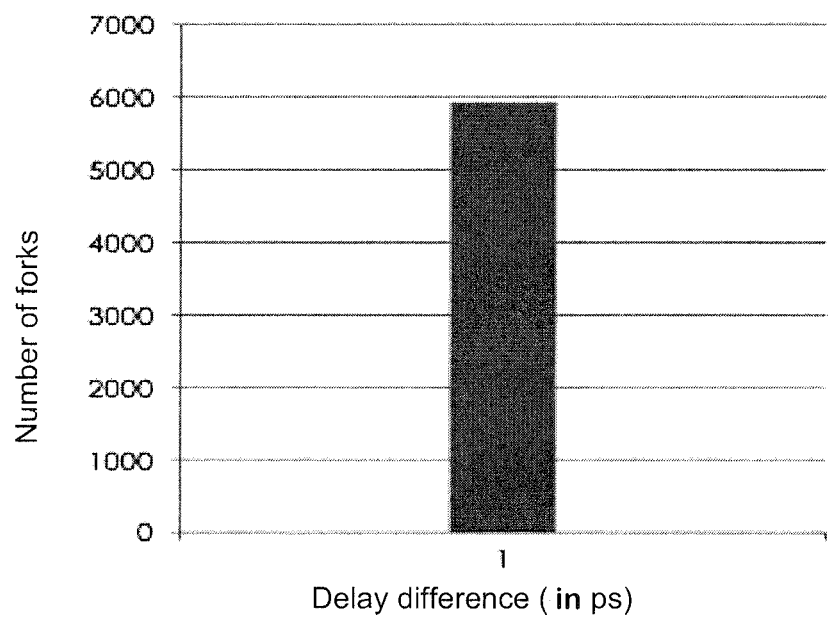
FIG. 20 shows the distribution of the isochronic forks of an asynchronous circuit designed according to the second technique of the invention, versus the time dispersion of its forks.

FIG. 20 shows the distribution of the isochronic forks of the circuit of FIG. 8, according to the delay dispersion in its isochronic forks, after having applied the above-described placing technique for all the imbalanced isochronic forks.

It can be observed that now, all isochronic forks in the circuit have a delay difference between their branches smaller than or equal to 1 ps. The risk of malfunction of these forks is thus considerably decreased, or even non-existent, since the slack calculated for the circuit cannot be lower than 1 ps.

Indeed, the slack is at least equal to the propagation time in a gate, which ranges from 20 to 30 ps for this circuit.

Each of these design techniques may be used separately. In practice, the first technique provides the best results since it totally suppresses the risk of malfunction. However, for an asynchronous circuit comprising several thousands (or even several tens of thousands) of isochronic forks, it may be difficult to apply it to all forks.

An asynchronous circuit design methodology which provides a good compromise between the circuit robustness to delay variations and the circuit manufacturing simplicity is now provided. Such a methodology jointly implements the two above-mentioned techniques.

The method comprises, first, identifying imbalanced forks, that is, those capable of introducing an error, and determining their level of danger.

The forks are then classified according to their level of danger. The level of danger of each fork can be defined by measuring the maximum propagation time dispersion between the branches of each fork (that is, the difference between the longest propagation time and the shortest propagation time), and by then comparing this maximum dispersion with a threshold. This threshold preferably depends on the slack allowed by the circuit. It is for example equal to twice the minimum slack of the circuit.

When the delay dispersion of a fork is greater than the threshold, its level of danger for the circuit operation is considered as high. It is then considered as a first-class fork and must be made delay-insensitive. The technique described in relation with FIGS. 9 to 18, which comprises introducing circuits for branching the branch outputs and a blocking circuit, will then be applied.

When the delay dispersion of a fork is lower than the threshold, said fork is assigned to a second class of lesser importance. The fork is considered to have a low level of danger. The placing technique described in relation with FIG. 19 will be reserved to such forks of lower dangerousness.

Thus, in addition to suppressing the isochronicity assumption in certain forks, the placing of the logic gates may be forced for other imbalanced forks having a lesser risk of malfunction.

Of course, when the delay dispersion is lower than the minimum slack, it is possible not to modify the fork. In practice, a safety margin, for example, 20% of the minimum slack, is provided to compensate for possible propagation time variations during the circuit operation. Thus, only forks having a delay dispersion greater than 0.8 times the minimum slack will be modified according to one of the two above-discussed techniques.

When it is not possible to measure the delay dispersion between branches, the level of danger of a fork may be only determined by knowing the slack or the time margin of the circuit associated with this fork. The slack is then compared with a predefined threshold. For example, for a slack lower than 30 ps, the level of danger is high and the fork belongs to the first class, and for a slack higher than 30 ps, the level of danger is low and the fork belongs to the second class.

The slack is assessed by determining the number of logic gate which characterize it, that is, the number of gates crossed by a signal before it causes a malfunction, and by adding then their average propagation delays.

Other variants and modifications of the asynchronous circuits described herein will occur to the person skilled in the art. Circuits DMUX, MERGE, and BUFFER may especially be designed in different ways. The logic states of the signals may for example all be inverted without modifying the operation of these circuits.

The above design techniques have been described in relation with a four-phase communication protocol. However, robust asynchronous circuits, based on a two-phase protocol, may also be obtained by applying such techniques. Finally, according to the logic functions executed by the circuits, logic gates G0 and G1 may be other than Muller gates. In certain cases, gates G0 and G1 may be "AND" gates.

We claim:

1. An asynchronous circuit comprising:
   a fork having at least two branches, each branch being connected to a logic gate so that the logic gate receives as input a branch-ending signal;
   a circuit for branching the branch-ending signal at the level of each logic gate to form a branched signal; and
   a blocking circuit comprising a Muller gate and receiving as input at least one branched signal, the blocking circuit being configured to prevent the propagation of an output signal when the branch-ending signals are in different logic states.

2. The asynchronous circuit according to claim 1, wherein the blocking circuit is separate from each logic gate.

3. The asynchronous circuit according to claim 1, wherein the blocking circuit receives all branch-ending signals, one at least being branched by a branching circuit.

4. The asynchronous circuit according to claim 3, wherein the blocking circuit receives as input all the branched signals and a signal to be blocked, the output signal being an acknowledgement signal.

5. The asynchronous circuit according to claim 1, comprising a blocking circuit for each logic gate, each blocking circuit comprising a Muller gate and receiving as input the branched signal associated with the logic gate and a data signal to be blocked, the output of the blocking circuit being connected to an input of the logic gate.

6. The asynchronous circuit according to claim 1, wherein each branched signal is a copy of the associated branch-ending signal.

7. The asynchronous circuit according to claim 1, wherein each branched signal is an inverted copy of the associated branch-ending signal.

8. The asynchronous circuit according to claim 7, comprising an inverter at the level of each logic gate.

9. A method for decreasing the delay sensitivity of an asynchronous circuit, comprising the steps of:
   providing a first isochronic fork having a first level of danger and comprising at least two branches, each connected to a logic gate;
   introducing a circuit for branching the branch-ending signal at the level of each logic gate to form a branched signal; and
   providing a blocking circuit comprising a Muller gate, receiving as input at least one branched signal and configured to prevent the propagation of an output signal when the branch-ending signals are in different logic states.

10. The method according to claim 9, comprising the steps of:
    providing a second isochronic fork having a second level of danger, lower than the first level of danger, and comprising at least two branches, each connected to a logic gate; and
    arranging the logic gates associated with the second fork in a limited area of the circuit, so as to limit the propagation delay dispersion between the branches of the second fork.

11. The method according to claim 10, wherein the first and second levels of danger are determined by measuring the maximum propagation time dispersion between the branches of each isochronic fork and by comparing the maximum dispersion with a threshold.

12. The method according to claim 10, wherein the first and second levels of danger are determined by assessing the time margin of the asynchronous circuit and by comparing the time margin with a threshold.

* * * * *